US008805694B2

(12) United States Patent
Lee et al.

(10) Patent No.: US 8,805,694 B2
(45) Date of Patent: Aug. 12, 2014

(54) METHOD AND APPARATUS FOR ENCODING AND DECODING AUDIO SIGNAL USING ADAPTIVE SINUSOIDAL CODING

(75) Inventors: Mi-Suk Lee, Daejeon (KR); Hyun-Joo Bae, Daejeon (KR); Byung-Sun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 80 days.

(21) Appl. No.: 13/201,517

(22) PCT Filed: Feb. 16, 2010

(86) PCT No.: PCT/KR2010/000955
§ 371 (c)(1),
(2), (4) Date: Aug. 15, 2011

(87) PCT Pub. No.: WO2010/093224
PCT Pub. Date: Aug. 19, 2010

(65) Prior Publication Data

US 2011/0301961 A1 Dec. 8, 2011

(51) Int. Cl.

*G10L 21/00* (2013.01)
*G10L 19/00* (2013.01)
*G10L 19/02* (2013.01)
*G10L 25/90* (2013.01)
*G10L 25/93* (2013.01)
*H03M 7/00* (2006.01)

(52) U.S. Cl.

USPC ........... 704/500; 704/229; 704/219; 704/501; 704/226; 704/203; 704/205; 704/200.1; 704/212; 704/207; 704/208; 704/230; 341/60

(58) Field of Classification Search

USPC ......... 704/229, 500, 219, 226, 501, 203, 201, 704/212, 200.1, 230; 341/60

See application file for complete search history.

(56) References Cited

U.S. PATENT DOCUMENTS 5,054,072 A 10/1991 McAulay et al.
5,222,189 A * 6/1993 Fielder .......................... 704/229

(Continued)

FOREIGN PATENT DOCUMENTS

CN 1945696 4/2007
JP 01-221800 9/1989

(Continued)

OTHER PUBLICATIONS

S. Singhal, "High Quality Audio Coding Using Multipulse LPC", IEEE, Acoustics, Speech, and Signal Processing,1995; pp. 3067-3069, vol. 5.*

(Continued)

*Primary Examiner* — Pierre-Louis Desir
*Assistant Examiner* — Anne Thomas-Homescu
(74) *Attorney, Agent, or Firm* — Staas & Halsey LLP

(57) ABSTRACT

A method and an apparatus for encoding and decoding audio signals using adaptive sinusoidal coding are provided. The audio signal encoding method includes the steps of dividing a synthesized audio signal into a plurality of sub-bands, calculating the energy of each sub-band, selecting a predetermined number of sub-bands having a relatively large amount of energy from the sub-bands, and performing sinusoidal coding with regard to the selected sub-bands. Application of sinusoidal coding based on consideration of the amount of energy of each sub-band of the synthesized signal improves the quality of the synthesized signal more efficiently.

12 Claims, 6 Drawing Sheets

(56) References Cited

U.S. PATENT DOCUMENTS

| | | | | |
|---|---|---|---|---|
| 5,742,734 | A * | 4/1998 | DeJaco et al. | 704/226 |
| 6,223,151 | B1 * | 4/2001 | Kleijn et al. | 704/207 |
| 6,263,312 | B1 * | 7/2001 | Kolesnik et al. | 704/500 |
| 6,377,916 | B1 * | 4/2002 | Hardwick | 704/208 |
| 7,599,833 | B2 * | 10/2009 | Sung et al. | 704/219 |
| 7,953,605 | B2 * | 5/2011 | Sinha et al. | 704/501 |
| 8,190,425 | B2 * | 5/2012 | Mehrotra et al. | 704/203 |
| 8,447,597 | B2 * | 5/2013 | Ide | 704/229 |
| 2006/0015328 | A1 * | 1/2006 | Van Schijndel et al. | 704/219 |
| 2006/0036435 | A1 * | 2/2006 | Kovesi et al. | 704/229 |
| 2006/0277040 | A1 * | 12/2006 | Sung et al. | 704/219 |
| 2007/0118362 | A1 * | 5/2007 | Kondo | 704/212 |
| 2008/0082321 | A1 | 4/2008 | Ide | |
| 2008/0136686 | A1 * | 6/2008 | Feiten | 341/60 |
| 2009/0037166 | A1 * | 2/2009 | Wang | 704/200.1 |
| 2009/0132261 | A1 * | 5/2009 | Kjorling et al. | 704/500 |
| 2009/0171672 | A1 * | 7/2009 | Philippe et al. | 704/500 |
| 2009/0210235 | A1 * | 8/2009 | Shirakawa et al. | 704/500 |
| 2009/0240491 | A1 * | 9/2009 | Reznik | 704/219 |
| 2010/0017198 | A1 * | 1/2010 | Yamanashi et al. | 704/205 |
| 2010/0106496 | A1 * | 4/2010 | Morii et al. | 704/230 |
| 2010/0121646 | A1 * | 5/2010 | Ragot et al. | 704/500 |
| 2010/0169081 | A1 * | 7/2010 | Yamanashi et al. | 704/203 |
| 2010/0250261 | A1 * | 9/2010 | Laaksonen et al. | 704/500 |
| 2010/0274555 | A1 * | 10/2010 | Laaksonen et al. | 704/201 |

FOREIGN PATENT DOCUMENTS

| | | |
|---|---|---|
| JP | 2007-187905 | 7/2007 |
| JP | 2008-89999 | 4/2008 |
| KR | 1998-7001162 | 4/1998 |
| KR | 10-2005-0078524 | 8/2005 |
| KR | 10-2006-0124568 | 12/2006 |
| KR | 10-2008-0086762 | 9/2008 |
| WO | 97/15984 | 5/1997 |
| WO | 2008/108076 | 9/2008 |

OTHER PUBLICATIONS

Y. Wang, "Audio Coding", eeweb.poly.edu/~yao/EE3414/audio_coding.pdf, 2004.*

S. Singhal, "High Quality Audio Coding Using Multipulse LPC", Acoustics, Speech, and Signal Processing 1990.*

H.W. Kim et al., "The trend of G.729.1 wideband multi-codec technology", ETRI's Electronics and Telecommunications Trends, vol. 21, No, 6, pp. 77-85, Dec. 2006.

Anibal J.S. Ferreira et al., "Accurate Spectral Replacement", Audio Engineering Society Convention Paper 6383, May 2005, pp. 1-11.

Deepen Sinha et al., "A New Broadcast Quality Low Bit Rate Audio Coding Scheme Utilizing Novel Bandwidth Extension Tools", Audio Engineering Society 119$^{th}$ Convention, Oct. 7-10, 2005, 13pp.

Balázs Kövesi et al., "A Scalable Speech and Audio Coding Scheme with Continuous Bitrate Flexibility", ICASSP 2004, pp. 273-276.

Deepen Sinha et al., "A New Broadcast Quality Low Bit Rate Audio Coding Scheme Utilizing Novel Bandwidth Extension Tools", Audio Engineering Society 119$^{th}$ Convention, Oct. 7-10, 2005, 13pages.

R.S. Cheung et al., "High Quality 16 kb/s Voice Transmission: the Subband Coder Approach", Acoustics, Speech, and Signal Processing, IEEE International Conference on ICASSP '80, Apr. 1980, pp. 319-322.

International Search Report for PCT/KR2010/000955, mailed Sep. 27, 2010.

* cited by examiner

METHOD AND APPARATUS FOR ENCODING AND DECODING AUDIO SIGNAL USING ADAPTIVE SINUSOIDAL CODING

CROSS REFERENCE TO RELATED APPLICATIONS

This application claims the benefit of International Application No. PCT/KR2010/000955, filed Feb. 16, 2010, and claims the benefit of Korean Application No. 10-2009-0012356, filed, and Korean Application No. 10-2009-0092717, filed Sep. 29, 2009, the disclosures of all of which are incorporated herein by reference.

TECHNICAL FIELD

Exemplary embodiments of the present invention relate to a method and an apparatus for encoding and decoding audio signals; and, more particularly, to a method and an apparatus for encoding and decoding audio signals using adaptive sinusoidal coding.

BACKGROUND ART

As the bandwidth for data transmission increases in conjunction with development of communication technology, user demands for a high-quality service using multi-channel speech and audio are on the increase. Provision of high-quality speech and audio services requires, above all, coding technology capable of efficiently compressing and decompressing stereo speech and audio signals.

Therefore, extensive study on codecs for coding Narrow Band (NB: 300-3,400 Hz), Wide Band (WB: 50-7,000 Hz), and Super Wide Band (SWB: 50-14,000 Hz) signals are in progress. For example, ITU-T G.729.1 is a representative extension codec, which is a WB extension codec based on G.729 (NB codec). This codec provides bitstream-level compatibility with G.729 at 8 kbit/s, and provides NB signals of better quality at 12 kbit/s. In the range of 14-32 kbit/s, the codec can code WB signals with bitrate scalability of 2 kbit/s, and the quality of output signals improves as the bitrate increases.

Recently, an extension codec capable of providing SWB signals based on G.729.1 is being developed. This extension codec can encode and decode NB, WB, and SWB signals.

In such an extension codec, sinusoidal coding may be used to improve the quality of synthesized signals. When the sinusoidal coding is used, the energy of input signals needs to be considered to increase coding efficiency. Specifically, when the number of bits available for sinusoidal coding is insufficient, it is efficient to preferentially code a band that has a larger influence on the quality of synthesized signals, i.e. a band that has a relatively large amount of energy.

DISCLOSURE

Technical Problem

An embodiment of the present invention is directed to a method and an apparatus for encoding and decoding audio signals, which can improve the quality of synthesized signals using sinusoidal coding.

Another embodiment of the present invention is directed to a method and an apparatus for encoding and decoding audio signals, which can improve the quality of a synthesized signal more efficiently by applying sinusoidal coding based on consideration of the amount of energy of each sub-band of the synthesized signal.

Objects of the present invention are not limited to the above-mentioned ones, and other objects and advantages of the present invention can be understood by the following description and become apparent with reference to the embodiments of the present invention. Also, it is obvious to those skilled in the art to which the present invention pertains that the objects and advantages of the present invention can be realized by the means as claimed and combinations thereof.

Technical Solutions

In accordance with an embodiment of the present invention, a method for encoding an audio signal includes: dividing a converted audio signal into a plurality of sub-bands; calculating energy of each of the sub-bands; selecting a predetermined number of sub-bands having a relatively large amount of energy from the sub-bands; and performing sinusoidal coding with regard to the selected sub-bands.

In accordance with another embodiment of the present invention, an apparatus for encoding an audio signal includes: an input unit configured to receive a converted audio signal; a calculation unit configured to divide a synthesized audio signal into a plurality of sub-bands, calculate energy of each of the sub-bands, and select a predetermined number of sub-bands having a relatively large amount of energy from the sub-bands; and a coding unit configured to perform sinusoidal coding with regard to the selected sub-bands.

In accordance with another embodiment of the present invention, a method for decoding an audio signal includes: receiving a converted audio signal; dividing an encoded audio signal into a plurality of sub-bands; calculating energy of each of the sub-bands; selecting a predetermined number of sub-bands having a relatively large amount of energy from the sub-bands; and performing sinusoidal decoding with regard to the selected sub-bands.

In accordance with another embodiment of the present invention, an apparatus for decoding an audio signal includes: an input unit configured to receive a converted audio signal; a calculation unit configured to divide an encoded audio signal into a plurality of sub-bands, calculate energy of each of the sub-bands, and select a predetermined number of sub-bands having a relatively large amount of energy from the sub-bands; and a decoding unit configured to perform sinusoidal decoding with regard to the selected sub-bands.

In accordance with another embodiment of the present invention, a method for encoding an audio signal includes: receiving an audio signal; performing Modified Discrete Cosine Transform (MDCT) with regard to the audio signal to output a MDCT coefficient; synthesizing a high-frequency audio signal using the MDCT coefficient; and performing sinusoidal coding with regard to the high-frequency audio signal.

In accordance with another embodiment of the present invention, an apparatus for encoding an audio signal includes: an input unit configured to receive an audio signal; a MDCT unit configured to perform MDCT with regard to the audio signal to output a MDCT coefficient; a synthesis unit configured to synthesize a high-frequency audio signal using the MDCT coefficient; and a sinusoidal coding unit configured to perform sinusoidal coding with regard to the high-frequency audio signal.

In accordance with another embodiment of the present invention, a method for decoding an audio signal includes: receiving an audio signal; performing MDCT with regard to the audio signal to output a MDCT coefficient; synthesizing a high-frequency audio signal using the MDCT coefficient; and performing sinusoidal decoding with regard to the high-frequency audio signal.

In accordance with another embodiment of the present invention, an apparatus for decoding an audio signal includes: an input unit configured to receive an audio signal; a MDCT unit configured to perform MDCT with regard to the audio signal to output a MDCT coefficient; a synthesis unit configured to synthesize a high-frequency audio signal using the MDCT coefficient; and a sinusoidal decoding unit configured to perform sinusoidal decoding with regard to the high-frequency audio signal.

Advantageous Effects

In accordance with the exemplary embodiments of the present invention, the quality of a synthesized signal is improved using sinusoidal coding.

In addition, application of sinusoidal coding based on consideration of the amount of energy of each sub-band of the synthesized signal improves the quality of the synthesized signal more efficiently.

MODE FOR THE INVENTION

Figure 1:
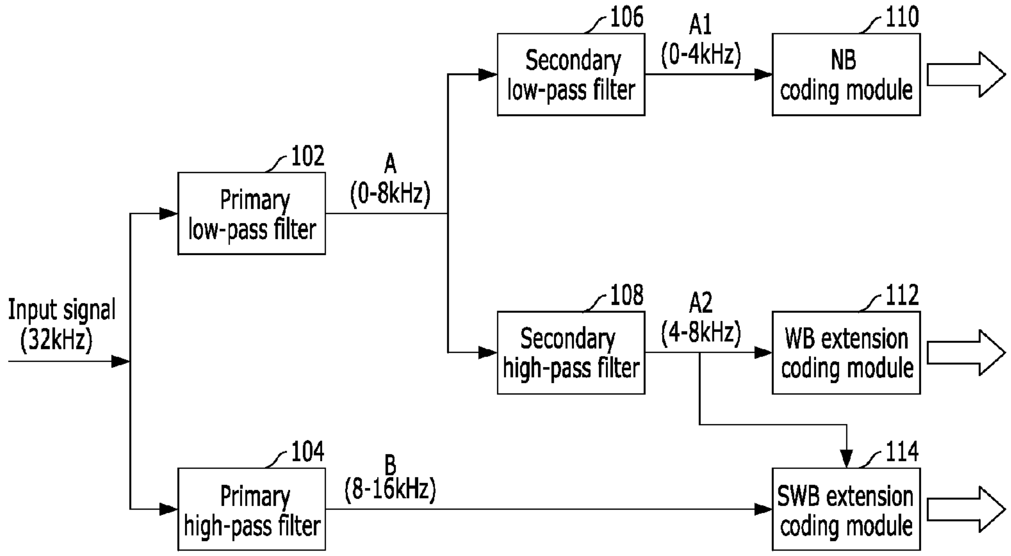
FIG. 1 shows the structure of a SWB extension codec which provides compatibility with a NB codec.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 shows the structure of a SWB extension codec which provides compatibility with a NB codec.

In general, an extension codec has a structure in which an input signal is divided into a number of frequency bands, and signals in respective frequency bands are encoded or decoded. Referring to FIG. 1, an input signal is inputted to a primary low-pass filter 102 and a primary high-pass filter 104. The primary low-pass filter 102 is configured to perform filtering and downsampling so that a low-band signal A (0-8 kHz) of the input signal is outputted. The primary high-pass filter 104 is configured to perform filtering and downsampling so that a high-band signal B (8-16 kHz) of the input signal is outputted.

The low-band signal A outputted from the primary low-pass filter 102 is inputted to a secondary low-pass filter 106 and a secondary high-pass filter 108. The secondary low-pass filter 106 is configured to perform filtering and downsampling so that a low-low-band signal A1 (0-4 kHz) is outputted. The secondary high-pass filter 108 is configured to perform filtering and downsampling so that a low-high-band signal A2 (4-8 kHz) is outputted.

Consequently, the low-low-band signal A1 is inputted to a NB coding module 110, the low-high-band signal A2 is inputted to a WB extension coding module 112, and the high-band signal B is inputted to a SWB extension coding module 114. When the NB coding module 110 solely operates, only a NB signal is regenerated and, when both the NB coding module 110 and the WB extension coding module 112 operate, a WB signal is regenerated. When all of the NB coding module 110, the WB extension coding module 112, and the SWB extension coding module 114 operate, a SWB signal is regenerated.

A representative example of the extension codecs shown in FIG. 1 may be ITU-T G.729.1, which is a WB extension codec based on G.729 (NB codec). This codec provides bitstream-level compatibility with G.729 at 8 kbit/s, and provides NB signals of much improved quality at 12 kbit/s. In the range of 14-32 kbit/s, the codec can code WB signals with bitrate scalability of 2 kbit/s, and the quality of output signals improves as the bitrate increases.

Recently, an extension codec capable of providing SWB quality based on G.729.1 is being developed. This extension codec can encode and decode NB, WB, and SWB signals.

In such an extension codec, different coding schemes may be applied for respective frequency bands as shown in FIG. 1. For example, G.729.1 and G.711.1 codecs employ a coding scheme in which NB signals are coded using conventional NB codecs, i.e. G.729 and G.711, and Modified Discrete Cosine Transform (MDCT) is performed with regard to remaining signals so that outputted MDCT coefficients are coded.

In the case of MDCT domain coding, a MDCT coefficient is divided into a plurality of sub-bands, the gain and shape of each sub-band are coded, and Algebraic Code-Excited Linear Prediction (ACELP) or pulses are used to code the MDCT coefficient. An extension codec generally has a structure in which information for bandwidth extension is coded first and information for quality improvement is then coded. For example, a signal in the 7-14 kHz band is synthesized using the gain and shape of each sub-band, and the quality of the synthesized signal is improved using ACELP or sinusoidal coding.

Specifically, in the first layer providing SWB quality, a signal corresponding to the 7-14 kHz band is synthesized using information such as gain and shape. Then, additional bits are used to apply sinusoidal coding, for example, to improve the quality of the synthesized signal. This structure can improve the quality of the synthesized signal as the bitrate increases.

Generally, in the case of sinusoidal coding, information regarding the position, amplitude, and sign of a pulse having the largest amplitude in a given interval, i.e. a pulse having the greatest influence on quality, is coded. The amount of calculation increases in proportion to such a pulse search interval. Therefore, instead of applying sinusoidal coding to the entire frame (in the case of time domain) or entire frequency band, sinusoidal coding is preferably applied for each sub-frame or sub-band. Sinusoidal coding is advantageous in that, although a relatively large number of bits are needed to transmit one pulse, signals affecting signal quality can be expressed accurately.

The energy distribution of signals inputted to a codec varies depending on the frequency. Specifically, in the case of music signals, energy variation in terms of frequency is severer than in the case of speech signals. Signals in a sub-band having a large amount of energy have a larger influence on the quality of the synthesized signal. There will be no problem if there are enough bits to code the entire sub-band, but if not, it is efficient to preferentially code signals in a sub-band having a large influence on the quality of the synthesized signal, i.e. having a large amount of energy.

The present invention is directed to encoding and decoding of audio signals, which can improve the quality of synthesized signals by performing more efficient sinusoidal coding based on consideration of the limited bit number in the case of an extension codec as shown in FIG. 1. Hereinafter, speech and audio signals will simply be referred to as audio signals in the following description of the present invention.

Figure 2:
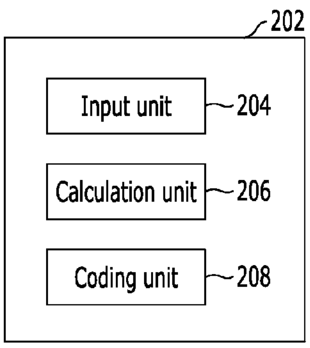
FIG. 2 shows the construction of an audio signal encoding apparatus in accordance with an embodiment of the present invention.

FIG. 2 shows the construction of an audio signal encoding apparatus in accordance with an embodiment of the present invention.

Referring to FIG. 2, the audio signal encoding apparatus 202 includes an input unit 204, a calculation unit 206, and a coding unit 208. The input unit 204 is configured to receive a converted audio signal, for example, a MDCT coefficient which is the result of conversion of an audio signal by MDCT.

The calculation unit 206 is configured to divide the converted audio signal, which has been inputted through the input unit 204, into a plurality of sub-bands and calculate the energy of each sub-band. The calculation unit 206 is configured to select a predetermined number of sub-bands, which have a relatively large amount of energy, from the sub-bands. The predetermined number is determined by the number of pulses to be coded in one sub-band and the number of bits necessary to code one pulse.

The coding unit 208 is configured to perform sinusoidal coding with regard to the sub-bands selected by the calculation unit 206. The coding unit 208 may perform sinusoidal coding with regard to a predetermined number of sub-bands, which have a relatively large amount of energy, in the order of the amount of energy. In accordance with another embodiment of the present invention, the coding unit 208 may perform sinusoidal coding with regard to a predetermined number of sub-bands, which have a relatively large amount of energy, in an order other than the order of the amount of energy, for example, in the order of bandwidth or index.

The calculation unit 206 may confirm if there are adjacent sub-bands among the selected sub-bands and merge the adjacent sub-bands into one sub-band. The coding unit 208 may then perform sinusoidal coding with regard to the sub-band merged in this manner.

Figure 3:
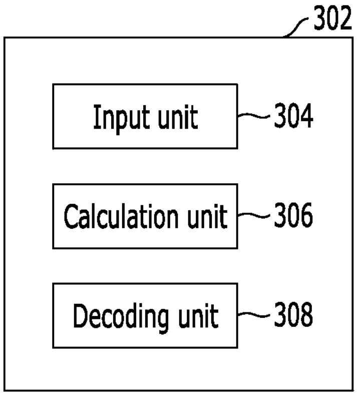
FIG. 3 shows the construction of an audio signal decoding apparatus in accordance with an embodiment of the present invention.

FIG. 3 shows the construction of an audio signal decoding apparatus in accordance with an embodiment of the present invention.

Referring to FIG. 3, the audio signal decoding apparatus 302 includes an input unit 304, a calculation unit 306, and a decoding unit 308. The input unit 304 is configured to receive a converted audio signal, for example, a MDCT coefficient.

The calculation unit 306 is configured to divide the converted audio signal, which has been inputted through the input unit 304, into a plurality of sub-bands and calculate the energy of each sub-band. The calculation unit 306 is configured to select a predetermined number of sub-bands, which have a relatively large amount of energy, from the sub-bands. The predetermined number is determined by the number of pulses to be coded in one sub-band and the number of bits necessary to code one pulse.

The decoding unit 308 is configured to perform sinusoidal decoding with regard to the sub-bands selected by the calculation unit 306. The decoding unit 308 may perform sinusoidal coding with regard to a predetermined number of sub-bands, which have a relatively large amount of energy, in the order of the amount of energy. In accordance with another embodiment of the present invention, the decoding unit 308 may perform sinusoidal coding with regard to a predetermined number of sub-bands, which have a relatively large amount of energy, in an order other than the order of the amount of energy, for example, in the order of bandwidth or index.

The audio signal encoding apparatus 202 and the audio signal decoding apparatus 302 shown in FIGS. 2 and 3 may be included in the NB coding module 110, the WB extension coding module 112, or the SWB extension coding module 114 shown in FIG. 1.

Hereinafter, methods for encoding and decoding audio signals in accordance with an embodiment of the present invention will be described with reference to FIGS. 4 to 6 in connection with exemplary encoding or decoding of audio signals by the SWB extension coding module 114 shown in FIG. 1.

The SWB extension coding module 114 divides a MDCT coefficient, which corresponds to 7-14 kHz, into a number of sub-bands, and codes or decodes the gain and shape of each sub-band to obtain an error signal. The SWB extension coding module 114 then performs sinusoidal coding or decoding with regard to the error signal. If there are a sufficient number of bits to be used for sinusoidal coding, sinusoidal coding could be applied to every sub-band. However, since the bit number is hardly sufficient in most cases, sinusoidal coding is only applied with regard to a limited number of sub-bands. Therefore, application of sinusoidal coding to sub-bands, which have a larger influence on the quality of synthesized signals, guarantees that, given the same bitrate, better signal quality is obtained.

Figure 4:
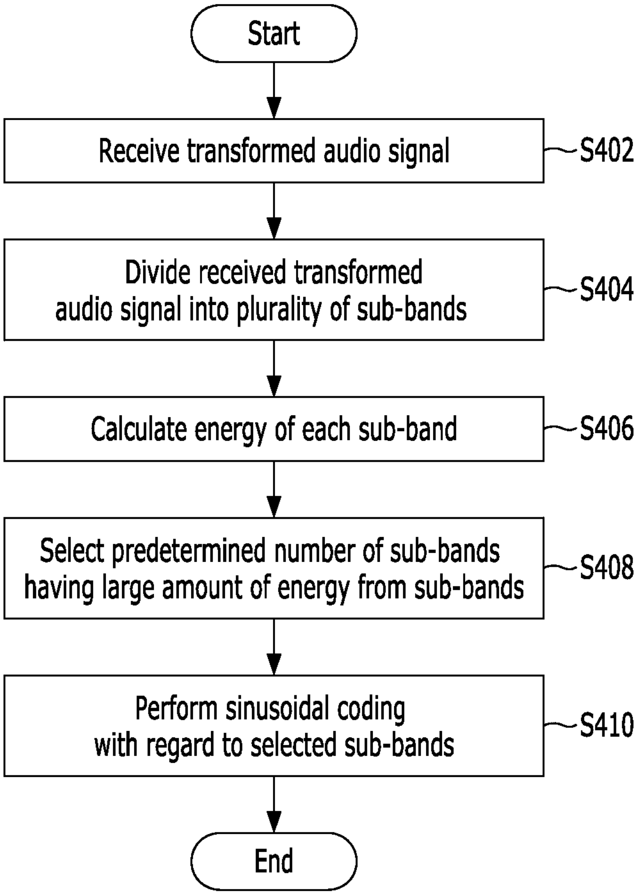
FIG. 4 is a flowchart showing an audio signal encoding method in accordance with an embodiment of the present invention.

FIG. 4 is a flowchart showing an audio signal encoding method in accordance with an embodiment of the present invention.

Figure 7:
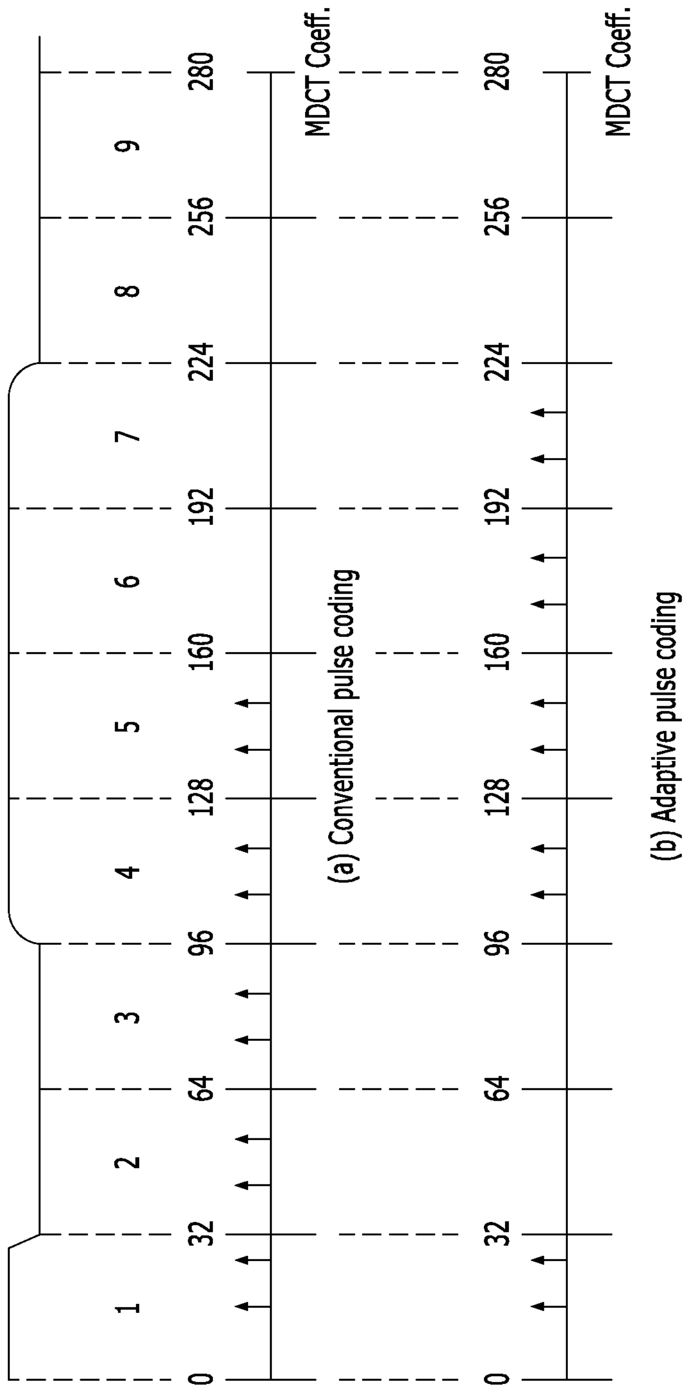
FIG. 7 shows a comparison between results of conventional sinusoidal coding and adaptive sinusoidal coding in accordance with the present invention.

Referring to FIG. 4, an audio signal encoding apparatus included in the SWB extension coding module 114 receives a converted audio signal, for example, a MDCT coefficient corresponding to 7-14 kHz at step S402. The apparatus divides the received converted audio signal into a plurality of sub-bands at step S404, and calculates the energy of each of the plurality of sub-bands at step S406. FIG. 7 shows a MDCT coefficient, which is divided into nine sub-bands, and the relative amount of energy of each sub-band. It is clear from FIG. 7 that the amount of energy of sub-bands 1, 4, 5, 6, and 7 is larger than that of other sub-bands.

Table 1 below enumerates the index and energy of the MDCT coefficient, which has been divided into eight sub-bands.

TABLE 1

| Index | 1 | 2 | 3 | 4 | 5 | 6 | 7 | 8 |
|---|---|---|---|---|---|---|---|---|
| Energy | 350 | 278 | 657 | 245 | 1500 | 780 | 200 | 190 |

The audio signal encoding apparatus selects a predetermined number of sub-bands, which have a large amount of energy, from the sub-bands at step S408. For example, the MDCT coefficient of Table 1 is sorted in the order of energy, as shown in Table 2 below, and five sub-bands (shaded) having the largest amount of energy are selected from them.

TABLE 2

| Index | 5 | 6 | 3 | 1 | 2 | 4 | 7 | 8 |
|---|---|---|---|---|---|---|---|---|
| Energy | 1500 | 780 | 657 | 350 | 278 | 245 | 200 | 190 |

In accordance with the present invention, a predetermined number (e.g. five) of sub-bands are selected as shown in Table 2. The predetermined number is determined by the number of pulses to be coded in one sub-band and the number of bits necessary to code one pulse.

The number of bits necessary to code one pulse is determined as follows: One bit is needed to code the sign (+,−) of one pulse. The number of bits needed to code the position of the pulse is determined by the size of the pulse search interval, for example, the size of one sub-band. If the size of a sub-band is 32, five bits are needed to code the position of a pulse ($2^5$=32). The number of bits needed to code the amplitude (gain) of the pulse is determined by the structure of the quantizer and the size of the codebook. In summary, the number of bits necessary to code one pulse is the total number of bits needed to code the sign, position, and amplitude of the pulse.

It will be assumed that, having confirmed the number of bits given for sinusoidal coding and the number of bits necessary to code one pulse, ten pulses can be transmitted. When two pulses are coded for each sub-band, sinusoidal coding can be applied to a total of five sub-bands. Therefore, the audio signal coding apparatus selects five sub-bands, which have the largest amount of energy, as shown in Table 2, and performs sinusoidal coding with regard to the selected sub-bands 5, 6, 3, 1, and 2 at step S410.

Figure 5:
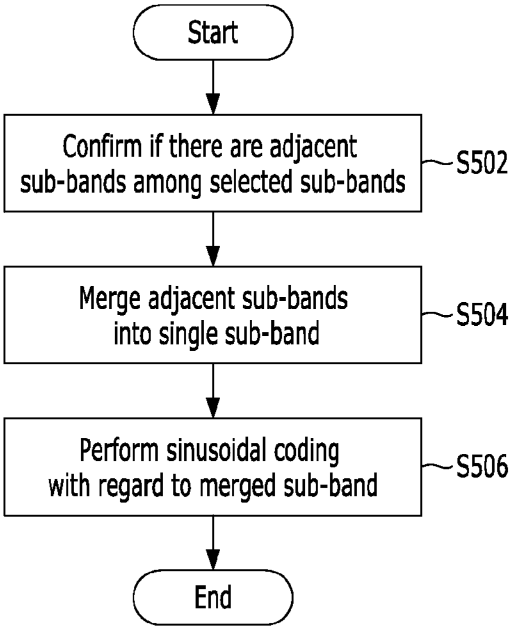
FIG. 5 is a flowchart showing a step (S410 in FIG. 4) of performing sinusoidal coding in accordance with an embodiment of the present invention.

FIG. 5 is a flowchart showing a step (S410 in FIG. 4) of performing sinusoidal coding in accordance with an embodiment of the present invention.

In accordance with another embodiment of the present invention, it is confirmed at step S502 if there are adjacent sub-bands among the sub-bands selected at the step S408 of FIG. 4. The adjacent sub-bands are merged into one sub-band at step S504, and sinusoidal coding is performed with regard to the merged sub-band at step S506.

For example, assuming that five sub-bands 5, 6, 3, 1, and 2 have been selected as shown in Table 2, it is confirmed if the sub-band 5 has an adjacent sub-band, i.e. sub-band 4 or 6, among the selected sub-bands. It is confirmed that the sub-band 6, which is adjacent to the sub-band 5, is included in the five sub-bands. Therefore, instead of coding two pulses for each of the sub-bands 5 and 6, the audio signal encoding apparatus merges the two sub-bands into a single sub-band and codes four pulses with regard to the single sub-band. For example, if the sub-band 5 has a larger amount of energy than the sub-band 6, all of the four pulses may be positioned in the sub-band 5 in the merged sub-band. As such, merging adjacent sub-bands and applying sinusoidal coding to the merged sub-band guarantee more efficient sinusoidal coding.

Meanwhile, depending on the characteristics of the codec, signals in the 7-14 kHz band synthesized by the encoder and the decoder may not coincide with each other. In order to reduce errors resulting from the difference of energy of sub-bands calculated by the encoder and the decoder, respectively, the audio signal encoding apparatus may rearrange the sub-bands, as shown in Table 3 below, and perform sinusoidal coding.

TABLE 3

| Index | 1 | 2 | 3 | 5 | 6 | 4 | 7 | 8 |
|---|---|---|---|---|---|---|---|---|
| Energy | 350 | 278 | 657 | 1500 | 780 | 245 | 200 | 190 |

That is, instead of performing sinusoidal coding with regard to the five sub-bands in the order of the amount of energy, the audio signal encoding apparatus may perform sinusoidal coding in the order of bandwidth or index. As such, no consideration of the order of the amount of energy of the selected sub-bands reduces errors resulting from the difference of higher-band synthesized signals that may occur in the encoder and the decoder.

Figure 6:
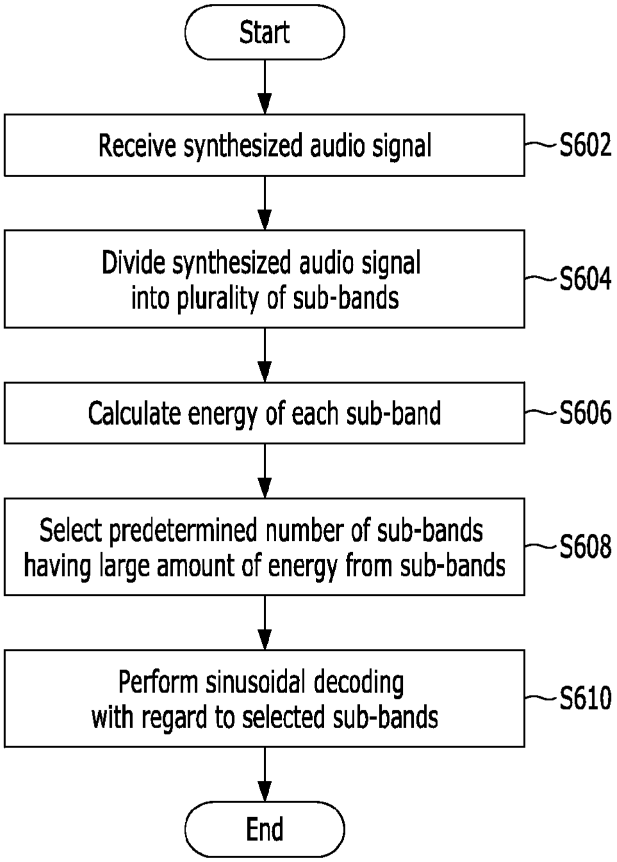
FIG. 6 is a flowchart showing an audio signal decoding method in accordance with an embodiment of the present invention.

FIG. 6 is a flowchart showing an audio signal decoding method in accordance with an embodiment of the present invention.

Firstly, a converted audio signal is received at step S602. The converted audio signal is divided into a plurality of sub-bands at step S604, and the energy of each sub-band is calculated at step S606.

A predetermined number of sub-bands, which have a large amount of energy, are selected from the sub-bands at step S608, and sinusoidal decoding is performed with regard to the selected sub-bands at step S610. The steps S602 to S610 of FIG. 6 are similar to respective steps of the above-described audio signal encoding method in accordance with an embodiment of the present invention, and detailed description thereof will be omitted herein.

FIG. 7 shows a comparison between results of conventional sinusoidal coding and adaptive sinusoidal coding in accordance with the present invention.

In FIG. 7, (a) corresponds to the result of conventional sinusoidal coding. It is clear from a comparison of the relative amount of energy of each sub-band shown in FIG. 7 that the amount of energy of sub-bands 1, 4, 5, 6, and 7 is larger than that of other sub-bands. However, conventional sinusoidal coding applies sinusoidal coding in the order of bandwidth or index, regardless of the amount of energy of the sub-bands, so that pulses are coded with regard to sub-bands 1, 2, 3, 4, and 5 as shown in (a).

In FIG. 7, (b) corresponds to the result of adaptive sinusoidal coding in accordance with the present invention. It is clear from (b) that, in accordance with the present invention, sinusoidal coding is applied to sub-bands having a relatively large amount of energy, i.e. sub-bands 1, 4, 5, 6, and 7.

As mentioned above, the present invention is applicable to audio signals including speech. The energy distribution of speech signals is as follows: voiced sounds have energy mostly positioned in low frequency bands, and unvoiced and plosives sounds have energy positioned in relatively high frequency bands. In contrast, the energy of music signals is greatly varied depending on the frequency. This means that, unlike speech signals, it is difficult to define the characteristics of energy distribution of music signals in terms of the frequency band. The quality of synthesized signals is more influenced by signals in a frequency band having a large amount of energy. Therefore, instead of fixing sub-bands to which sinusoidal coding is to be applied, selecting sub-bands according to the characteristics of input signals and applying pulse cording accordingly, as proposed by the present invention, can improve the quality of signals synthesized at the same bitrate.

Methods and apparatuses for encoding and decoding audio signals in accordance with another embodiment of the present invention will now be described with reference to FIGS. 8 and 9.

Figure 8:
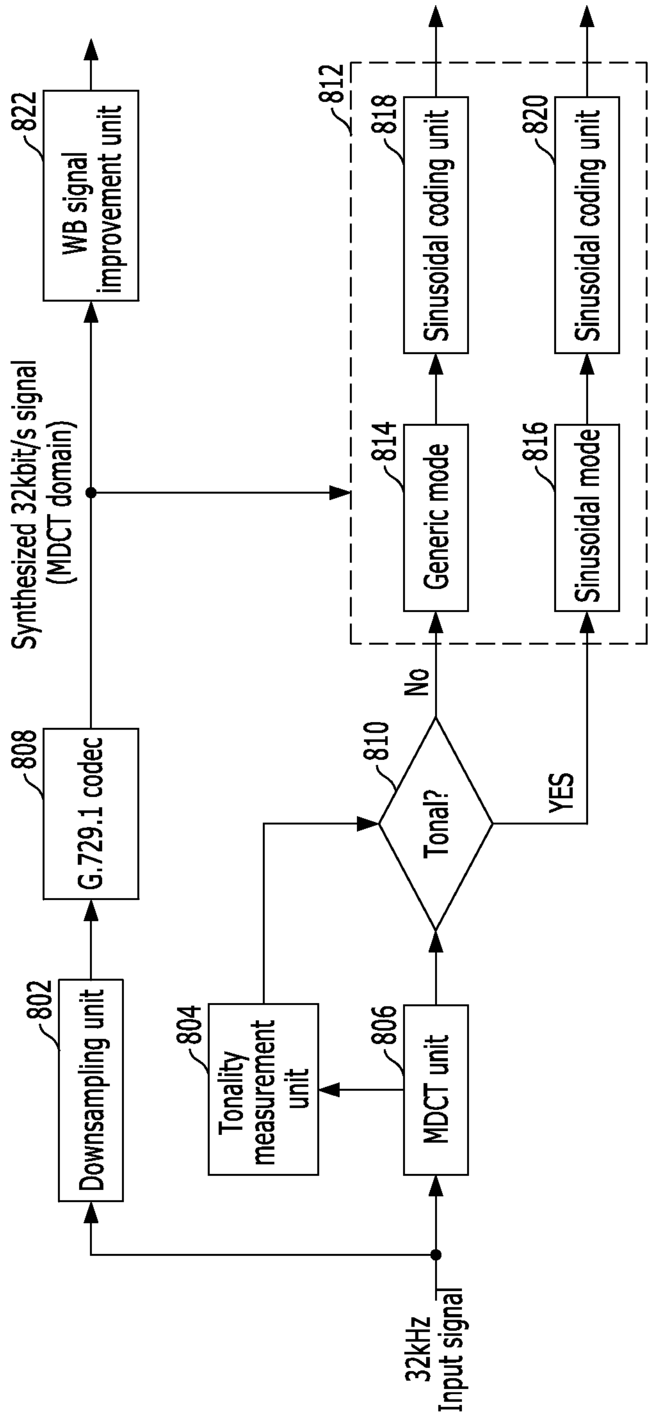
FIG. 8 shows the construction of an audio signal encoding apparatus in accordance with another embodiment of the present invention.

FIG. 8 shows the construction of an audio signal encoding apparatus in accordance with another embodiment of the present invention.

The audio signal encoding apparatus shown in FIG. 8 is configured to receive an input signal of 32 kHz and synthesize and output WB and SWB signals. The audio signal encoding apparatus includes a WB extension coding module 802, 808, and 822 and a SWB extension coding module 804, 806, 810, and 812. The WB extension module, specifically G.729.1 core codec, operates using 16 kHz signals, while the SWB extension coding module uses 32 kHz signals. SWB extension coding is performed in the MDCT domain. Two modes, i.e. a generic mode 814 and a sinusoidal mode 816 are used to code the first layer of the SWB extension coding module. Determination regarding which of the generic and sinusoidal modes 814 and 816 is to be used is made based on the measured tonality of the input signal. Higher SWB bands are coded by sinusoidal coding units 818 and 820, which improve the quality of high-frequency content, or by a WB signal improvement unit 822, which is used to improve the perceptual quality of WB content.

An input signal of 32 kHz is first inputted into the downsampling unit 802, and is downsampled to 16 kHz. The downsampled 16 kHz signal is inputted to the G.729.1 codec 808. The G.729.1 codec 808 performs WB coding with regard to the inputted 16 kHz signal. The synthesized 32 kbit/s signal outputted from the G.729.1 codec 808 is inputted to the WB signal improvement unit 822, and the WB signal improvement unit 822 improves the quality of the inputted signal.

On the other hand, a 32 kHz input signal is inputted to the MDCT unit 806 and converted into a MDCT domain. The input signal converted into the MDCT domain is inputted to the tonality measurement unit 804 to determine whether the input signal is tonal or not at step S810. In other words, the coding mode in the first SWB layer is defined based on tonality measurement, which is performed by comparing the logarithmic domain energies of current and previous frames of the input signal in the MDCT domain. The tonality measurement is based on correlation analysis between spectral peaks of current and previous frames of the input signal.

Based on the tonality information outputted by the tonality measurement unit 804, it is determined whether the input signal is tonal or not at step S810. For example, if the tonality information is above a given threshold, it is confirmed that the input signal is tonal and, if not, it is confirmed that the input signal is not tonal. The tonality information is also included in the bitstream transferred to the decoder. If the input signal is tonal, the sinusoidal mode 816 is used and, if not, the generic mode 814 is used.

The generic mode 814 is used when the frame of the input signal is not tonal (tonal=0). The generic mode 814 utilizes a coded MDCT domain expression of the G.729.1 WB codec 808 to code high frequencies. The high-frequency band (7-14 kHz) is divided into four sub-bands, and selected similarity criteria regarding each sub-band are searched from coded, enveloped-normalized WB content. The most similar match is scaled by two scaling factors, specifically the first scaling factor of the linear domain and the second scaling factor of the logarithmic domain, to acquire synthesized high-frequency content. This content is also improved by additional pulses within the sinusoidal coding unit 818 and the generic mode 814.

In the generic mode 814, the quality of coded signals can be improved by the audio encoding method in accordance with the present invention. For example, the bit budget allows addition of two pulses to the first SWB layer of 4 kbit/s. The starting position of a track, which is used to search for the position of a pulse to be added, is selected based on the sub-band energy of a synthesized high-frequency signal. The energy of synthesized sub-bands can be calculated according to Equation 1 below.

$$SbE(k) = \sum_{n=0}^{n=31} \ddot{M}_{32}(k \times 32 + n)^2 \qquad k = 0, \ldots , 7 \qquad \text{(Eq. 1)}$$

wherein, k refers to the sub-band index, SbE(k) refers to energy of the $k^{th}$ sub-band, and $\ddot{M}_{32}(k)$ refers to a synthesized high-frequency signal. Each sub-band consists of 32 MDCT coefficients. A sub-band having a relatively large amount of energy is selected as a search track for sinusoidal coding. For example, the search track may include 32 positions having a unit size of 1. In this case, the search track coincides with the sub-band.

The amplitude of two pulses is quantized by 4-bit, one-dimensional codebook, respectively.

The sinusoidal mode 816 is used when the input signal is tonal. In the sinusoidal mode 816, a high-frequency signal is created by adding a set of a finite number of sinusoidal components to a high-frequency spectrum. For example, assuming that a total of ten pulses are added, four may be positioned in the frequency range of 7000-8600 Hz, four in the frequency range of 8600-10200 Hz, one in the frequency range of 10200-11800 Hz, and one in the frequency range of 11800-12600 Hz. The sinusoidal coding units 818 and 820 are configured to improve the quality of signals outputted by the generic mode 814 or the sinusoidal mode 816. The number (Nsin) of pulses added by the sinusoidal coding units 818 and 820 varies depending on the bit budget. Tracks for sinusoidal coding by the sinusoidal coding units 818 and 820 are selected based on the sub-band energy of high-frequency content.

For example, synthesized high-frequency content in the frequency range of 7000-13400 Hz is divided into eight sub-bands. Each sub-band consists of 32 MDCT coefficients, and the energy of each sub-band can be calculated according to the Equation 1.

Tracks for sinusoidal coding are selected by finding as many sub-bands having a relatively large amount of energy as Nsin/Nsin_track. In this regard, Nsin_track refers to the number of pulses per track, and is set to be 2. The selected (Nsin/Nsin_track) sub-bands correspond to tracks used for sinusoidal coding, respectively. For example, assuming that Nsin is 4, the first two pulses are positioned in a sub-band having the largest amount of sub-band energy, and the remaining two pulses are positioned in a sub-band having the second largest amount of energy. Track positions for sinusoidal coding vary frame by frame depending on the available bit budget and high-frequency signal energy characteristics.

Figure 9:
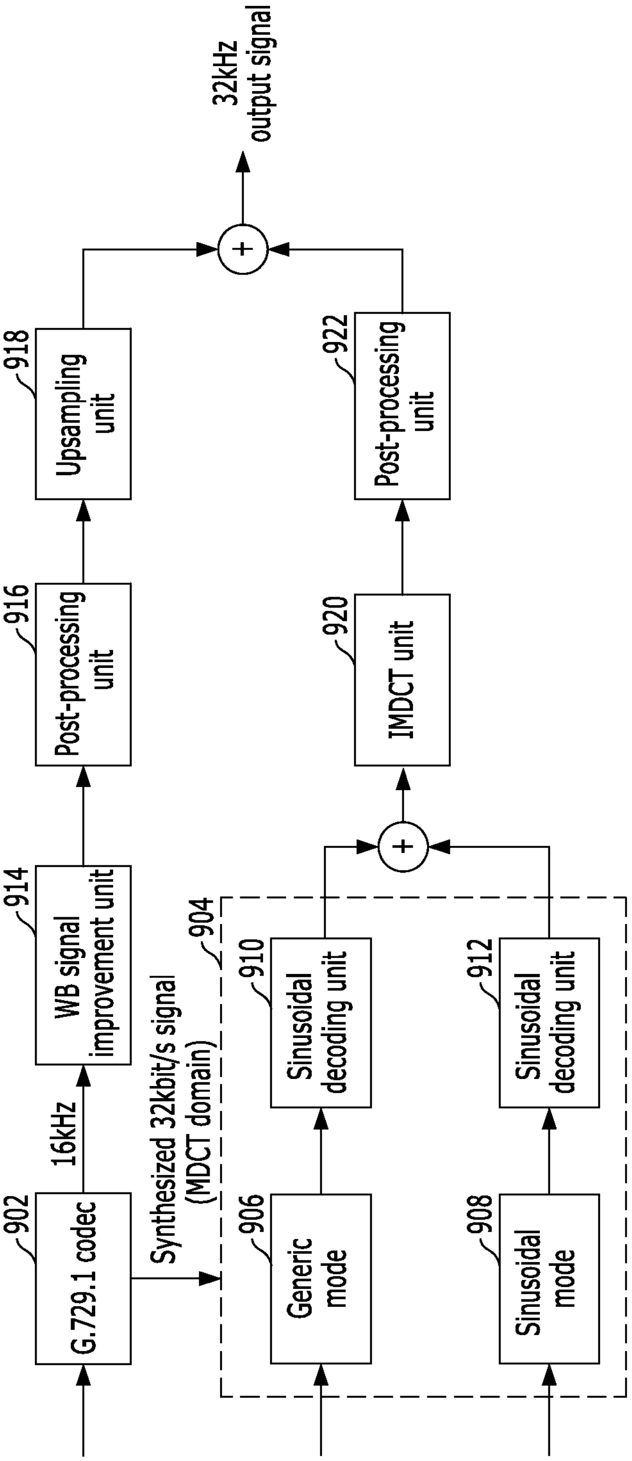
FIG. 9 shows the construction of an audio signal decoding apparatus in accordance with another embodiment of the present invention.

FIG. 9 shows the construction of an audio signal decoding apparatus in accordance with another embodiment of the present invention.

The audio signal decoding apparatus shown in FIG. 9 is configured to receive WB and SWB signals, which have been encoded by the encoding apparatus, and output a corresponding 32 kHz signal. The audio signal decoding apparatus includes a WB extension decoding module 902, 914, 916, and 918 and a SWB extension decoding module 902, 920, and 922. The WB extension decoding module is configured to decode an inputted 16 kHz signal, and the SWB extension decoding module is configured to decode high frequencies to provide a 32 kHz output. Two modes, specifically a generic mode 906 and a sinusoidal mode 908 are used to decode the first layer of extension, and this depends on the tonality indicator that is decoded first. The second layer uses the same bit allocation as the encoder to improve WB signals and distribute bits between additional pulses. The third SWB layer consists of sinusoidal decoding units 910 and 912, and this improves the quality of high-frequency content. The fourth and fifth extension layers provide WB signal improvement. In order to improve synthesized SWB content, post-processing is used in the time domain.

A signal encoded by the encoding apparatus is inputted to the G.729.1 codec 902. The G.729.1 codec 902 outputs a synthesized signal of 16 kHz, which is inputted to the WB signal improvement unit 914. The WB signal improvement unit 914 improves the quality of the inputted signal. The signal outputted from the WB signal improvement unit 914 undergoes post-processing by the post-processing unit 916 and upsampling by the upsampling unit 918.

Meanwhile, prior to starting high-frequency decoding, a WB signal needs to be synthesized. Such synthesis is performed by the G.729.1 codec 902. In the case of high-frequency signal decoding, 32 kbit/s WB synthesis is used prior to applying a general post-processing function.

Decoding of a high-frequency signal begins by acquiring a MDCT domain expression synthesized from G.729.1 WB decoding. MDCT domain WB content is needed to decode the high-frequency signal of a generic coding frame, and the high-frequency signal in this case is constructed by adaptive replication of a coded sub-band from a WB frequency range.

The generic mode 906 constructs a high-frequency signal by adaptive sub-band replication. Furthermore, two sinusoidal components are added to the spectrum of the first 4 kbit/s SWB extension layer. The generic mode 906 and the sinusoidal mode 908 utilize similar enhancement layers based on sinusoidal mode decoding technology.

In the generic mode 906, the quality of decoded signals can be improved by the audio decoding method in accordance with the present invention. The generic mode 906 adds two sinusoidal components to the reconstructed entire high-frequency spectrum. These pulses are expressed in terms of position, sign, and amplitude. The starting position of a track, which is used to add pulses, is acquired from the index of a sub-band having a relatively large amount of energy, as mentioned above.

In the sinusoidal mode 908, a high-frequency signal is created by a set of a finite number of sinusoidal components. For example, assuming that a total of ten pulses are added, four may be positioned in the frequency range of 7000-8600 Hz, four in the frequency range of 8600-10200 Hz, one in the frequency range of 10200-11800 Hz, and one in the frequency range of 11800-12600 Hz.

The sinusoidal decoding units 902 and 912 are configured to improve the quality of signals outputted by the generic mode 906 or the sinusoidal mode 908. The first SWB improvement layer adds ten sinusoidal components to the high-frequency signal spectrum of a sinusoidal mode frame. In the generic mode frame, the number of added sinusoidal components is set according to adaptive bit allocation between low-frequency and high-frequency improvements.

The process of decoding by the sinusoidal decoding units 910 and 912 is as follows: Firstly, the position of a pulse is acquired from a bitstream. The bitstream is then decoded to obtain transmitted sign indexes and amplitude codebook indexes.

Tracks for sinusoidal decoding are selected by finding as many sub-bands having a relatively large amount of energy as Nsin/Nsin_track. In this regard, Nsin_track refers to the number of pulses per track, and is set to be 2. The selected (Nsin/Nsin_track) sub-bands correspond to tracks used for sinusoidal decoding, respectively.

Position indexes of ten pulses related to respective corresponding tracks are initially obtained from the bitstream. Then, signs of the ten pulses are decoded. Finally, the amplitude (three 8-bit codebook indexes) of the pulses is decoded.

The signals, the quality of which has been improved by the sinusoidal decoding units 910 and 912 in this manner, undergo inverse MDCT by the IMDCT 920 and post-processing by the post-processing unit 922. Signals outputted from the upsampling unit 918 and the post-processing unit 922 are added, so that a 32 kHz output signal is outputted.

While the present invention has been described with respect to the specific embodiments, it will be apparent to those skilled in the art that various changes and modifications may be made without departing from the spirit and scope of the invention as defined in the following claims.

The invention claimed is:

1. A method for encoding an audio signal, comprising:
- receiving a transformed audio signal;
- dividing the transformed audio signal into a plurality of sub-bands;
- calculating, by a processor, energy of each of the sub-bands;
- selecting, by the processor, a predetermined number of highest-energy sub-bands; and
- performing sinusoidal coding with regard to the selected sub-bands,
- wherein the performing sinusoidal coding with regard to the selected sub-bands includes selecting track positions in the selected sub-bands based on an amount of energy of each sub-band, and
- performing sinusoidal coding with regard to the tracks.

2. The method of claim 1, wherein the performing sinusoidal coding with regard to the selected sub-bands comprises:
- merging adjacent sub-bands among the selected sub-bands into one sub-band; and
- sinusoidal coding is performed with regard to the selected sub-bands in an order of the amount of energy.

3. An apparatus for encoding an audio signal, comprising:
- an input unit configured to receive a transformed audio signal;
- a calculation unit, including a processor, configured to divide the transformed audio signal into a plurality of sub-bands, calculate energy of each of the sub-bands, and select a predetermined number of highest-energy sub-bands; and
- a coding unit configured to perform sinusoidal coding with regard to the selected sub-bands, wherein the coding unit selects track positions in the selected sub-bands based on an amount of enemy of each sub-band, and performs the sinusoidal coding with regard to the tracks.

4. A method for decoding an audio signal, comprising:

receiving a transformed audio signal;

dividing the transformed audio signal into a plurality of sub-bands;

calculating, by a processor, energy of each of the sub-bands;

selecting, by the processor, a predetermined number of highest-energy sub-bands; and performing sinusoidal decoding with regard to the selected sub-bands, wherein the performing sinusoidal decoding with regard to the selected sub-bands includes selecting track positions in the selected sub-bands based on an amount of energy of each sub-band, and performing the sinusoidal decoding with regard to the tracks.

5. An apparatus for decoding an audio signal, comprising:

an input unit configured to receive a synthesized audio signal;

a calculation unit, including a processor, configured to divide the synthesized audio signal into a plurality of sub-bands, calculate energy of each of the sub-bands, and select a predetermined number of sub-bands in order of a large amount of energy of the sub-bands; and a decoding unit configured to perform sinusoidal decoding with regard to the selected sub-bands, wherein the decoding unit selects track positions in the selected sub-bands based on an amount of energy of each sub-band, and performs the sinusoidal decoding with regard to the tracks.

6. The method of claim 1, wherein the performing sinusoidal coding with regard to the selected sub-bands, adjacent sub-bands among the selected sub-bands are provided into one track.

7. The apparatus of claim 3, wherein the coding unit provides adjacent sub-bands among the selected sub-bands into one track.

8. The apparatus of claim 3, wherein the coding unit merges adjacent sub-bands among the selected sub-bands into one sub-band, and performs the sinusoidal coding with regard to the merged sub-band.

9. The method of claim 4, wherein the performing sinusoidal decoding with regard to the selected sub-bands, adjacent sub-bands among the selected sub-bands are provided into one track.

10. The method of claim 4, wherein the performing sinusoidal decoding with regard to the selected sub-bands comprises:

merging adjacent sub-bands among the selected sub-bands into one sub-band; and performing the sinusoidal decoding with regard to the merged sub-band.

11. The apparatus of claim 5, wherein the decoding unit provides adjacent sub-bands among the selected sub-bands into one track.

12. The apparatus of claim 5, wherein the decoding unit merges adjacent sub-bands among the selected sub-bands into one sub-band, and performs the sinusoidal decoding with regard to the merged sub-band.

* * * * *